(12) United States Patent
Hill et al.

(10) Patent No.: US 7,231,857 B2
(45) Date of Patent: Jun. 19, 2007

(54) DEPANELING SYSTEMS

(75) Inventors: Kurt John Hill, Berthoud, CO (US); Bob Allen Williams, Wheat Ridge, CO (US); Travis Wayne Groves, Longmont, CO (US); Allen W. Duck, Fort Collins, CO (US)

(73) Assignee: Cencorp USA, Inc.

( * ) Notice: Subject to any disclaimer, the term of this patent is extended or adjusted under 35 U.S.C. 154(b) by 0 days.

(21) Appl. No.: 10/348,870

(22) Filed: Jan. 22, 2003

(65) Prior Publication Data
US 2003/0164077 A1 Sep. 4, 2003

Related U.S. Application Data

(60) Provisional application No. 60/350,648, filed on Jan. 22, 2002.

(51) Int. Cl.
*B26D 7/01* (2006.01)
(52) U.S. Cl. ............... 83/100; 83/451; 269/21; 29/743
(58) Field of Classification Search ............ 83/451, 83/929.1, 100; 125/901; 451/388, 390; 269/21; 29/743
See application file for complete search history.

(56) References Cited

U.S. PATENT DOCUMENTS

| | | | | |
|---|---|---|---|---|
| 3,995,522 A | * | 12/1976 | Holliday | 83/451 |
| 4,269,549 A | * | 5/1981 | Block | 83/658 |
| 4,357,006 A | * | 11/1982 | Hayes | 83/451 |
| 4,358,975 A | * | 11/1982 | Higgins | 83/487 |
| 4,444,078 A | * | 4/1984 | Pearl | 83/451 |
| 4,494,433 A | * | 1/1985 | Gerber | 83/374 |
| 4,532,839 A | * | 8/1985 | Easton | 83/451 |
| 4,683,789 A | | 8/1987 | Lopez | |
| 4,685,363 A | * | 8/1987 | Gerber | 83/451 |
| 4,742,615 A | | 5/1988 | Lopez | |
| 5,063,800 A | * | 11/1991 | Jung et al. | 83/451 |
| 5,117,554 A | | 6/1992 | Grabow | |
| 5,144,873 A | * | 9/1992 | Nasu | 83/451 |
| 5,438,740 A | | 8/1995 | Carr et al. | |
| 5,566,457 A | * | 10/1996 | Batschari et al. | 83/478 |
| 5,618,759 A | * | 4/1997 | Boysel | 83/84 |
| 5,782,152 A | * | 7/1998 | Reis et al. | 83/100 |
| 5,894,648 A | | 4/1999 | Hill et al. | |

(Continued)

FOREIGN PATENT DOCUMENTS

DE 4021407 A1 1/1992

(Continued)

*Primary Examiner*—Jason Prone
(74) *Attorney, Agent, or Firm*—Duft Bornsen & Fishman, LLP

(57) ABSTRACT

A depaneling system is disclosed for cutting a panel. The depaneling system comprises a tooling apparatus and a cutting apparatus. The tooling apparatus helps hold the panel in place with suction during cutting of said panel and collects dust particles generated by the cutting of the panel. The cutting apparatus is comprised of a housing, a drive motor, a cutting unit, and a drive connector. The housing separates the drive motor from the cutting unit. The housing comprises a first section and a second section separated by a dividing member. The drive connector, such as a belt, passes through the first section of the housing. The second section of the housing forms a path for the dust particles.

13 Claims, 9 Drawing Sheets

U.S. PATENT DOCUMENTS

| | | | |
|---|---|---|---|
| 5,970,834 A * | 10/1999 | Garofano et al. | 83/90 |
| 6,152,003 A * | 11/2000 | Jung | 83/940 |
| 6,182,546 B1 * | 2/2001 | Hecker | 83/676 |
| 6,357,108 B1 | 3/2002 | Carr | |
| 6,718,858 B2 * | 4/2004 | Tripard | 83/929.1 |
| 6,736,703 B2 * | 5/2004 | Osada et al. | 83/490 |
| 6,787,382 B1 * | 9/2004 | Wing et al. | 83/167 |
| 2002/0083812 A1 * | 7/2002 | Lanzer | 83/615 |

FOREIGN PATENT DOCUMENTS

| | | |
|---|---|---|
| EP | 0596832 A1 | 11/1992 |
| EP | 0561742 A1 | 9/1993 |

\* cited by examiner

DEPANELING SYSTEMS

RELATED APPLICATIONS

This non-provisional application claims the benefit of the filing date of provisional application Ser. No. 60/350,648 filed on Jan. 22, 2002.

BACKGROUND OF THE INVENTION

1. Field of the Invention

The invention is related to the field of depaneling systems, and in particular, to depaneling systems with cleaner and more efficient operation.

2. Statement of the Problem

There are a variety of machines used to cut Printed Circuit Boards (PCB) out of a stock panel. Some of the PCBs that are cut are have components on them, and other PCBs are bare. Most machines on the market have a saw with a blade or router bit that is fixed in the machine and faces upwardly. The machines also have movable tooling positioned above the saw. To cut the PCBs out of a panel, the panel is clamped into the tooling. The tooling is then moved into place above the saw. The tooling then moves the panel over the saw to cut the PCBs from the panel.

There are other machines that have a movable saw. The saw may be positioned above the tooling instead of below the tooling. To cut the PCBs out of a panel, the panel is again clamped into or set onto the tooling. The tooling is then moved into place underneath the saw. The saw then moves over the panel to cut the PCBs from the panel. Some examples of depaneling systems are illustrated in U.S. Pat. No. 5,894,648, U.S. Pat. No. 5,438,740, U.S. Pat. No. 5,117,554, U.S. Pat. No. 4,683,789, and U.S. Pat. No. 4,742,615, which are all hereby incorporated by reference.

Most of the machines include some kind of suction with the saw to catch dust generated by cutting the PCBs. Unfortunately, these machines only catch the dust particles from one side of the PCB, that being the saw side. Dust on the other side of the panel, that being the tooling side of the PCB, may drift into the air.

The current machines also are direct drive, meaning that the saw blade is directly connected to the motor. Such a configuration saves space and allows for use or saw blades or router bits. Direct drive saws spin at speeds between 10,000 to 50,000 rpm. Unfortunately, these high speeds shorten the life of the saw blades. The high speeds also generate finer dust when cutting, which makes it more difficult to collect the dust during cutting.

SUMMARY OF THE SOLUTION

The invention helps solve the above problems with an improved depaneling system comprised of a tooling apparatus and a cutting apparatus. The tooling apparatus is configured to facilitate cutting of the panel by supporting a bottom side of the panel and helping to hold the panel in place with suction during cutting of the panel. The tooling apparatus also collects dust particles generated by cutting of the panel from the tooling apparatus side of the panel. The cutting apparatus is configured to cut the panel supported by the tooling apparatus.

The depaneling system advantageously uses a vacuum, or suction, to collect the dust particles from the tooling apparatus side of the panel, instead of just collecting the dust particles from the cutting apparatus side. The depaneling system also advantageously uses suction to help hold the panel in place for cutting.

In another example of the invention, the tooling apparatus is comprised of a vacuum chamber and a vacuum channel. The vacuum chamber has one or more openings on a top side of the vacuum chamber and is configured to provide suction to the openings. The vacuum channel has a first side configured to interface with the top side of the vacuum chamber and has a second side configured to interface with the panel to be cut. The vacuum channel has one or more openings to interface with the openings of the vacuum chamber. The vacuum chamber and the vacuum channel are configured to help hold the panel in place with the suction during cutting of the panel by the cutting apparatus. The vacuum chamber and the vacuum channel are also configured to collect the dust particles generated by cutting of the panel from the tooling apparatus side of the panel.

In another example of the invention, the cutting apparatus comprises a housing, a drive motor, a cutting unit, and a drive connector. The housing comprises a first section and a second section separated by a dividing member. The first section of the housing extends from a first end of the housing to a second end of the housing. The second section of the housing forms an enclosure between the second end of the housing and a vacuum hose connector. The drive motor is coupled to the first end of the housing and the cutting unit is coupled to the second end of the housing to separate the drive motor from the cutting unit. The drive connector, such as a belt, is configured to couple the drive motor to the cutting unit to rotate the cutting unit. The first section of the housing provides a path for the drive connector through the housing. The second section of the housing provides a dust path from the cutting unit to the vacuum hose connector.

The cutting apparatus advantageously uses the drive connector to drive the cutting unit instead of being a direct drive between the drive motor and the cutting unit. Using the drive connector and separating the drive motor and the cutting unit with the housing advantageously drives the cutting unit much slower than current direct drive systems. The slower speed of the saw blade increases the life of the saw blade. The slower speed also generates a less fine of a dust when cutting the panel. This advantageously results in a more efficient and a cleaner cutting apparatus.

Other examples of the invention may be provided below in the following description.

DESCRIPTION OF THE DRAWINGS

The same reference number represents the same element on all drawings.

DETAILED DESCRIPTION OF THE INVENTION

FIGS. 1-9 and the following description depict specific examples of a depaneling system to teach those skilled in the art how to make and use the best mode of the invention. For the purpose of teaching inventive principles, some conventional aspects of the depaneling system have been simplified or omitted. Those skilled in the art will appreciate variations from these examples that fall within the scope of the invention. Those skilled in the art will appreciate that the features described below can be combined in various ways to form multiple variations of the invention. As a result, the invention is not limited to the specific examples described below, but only by the claims and their equivalents.

Figure 1:
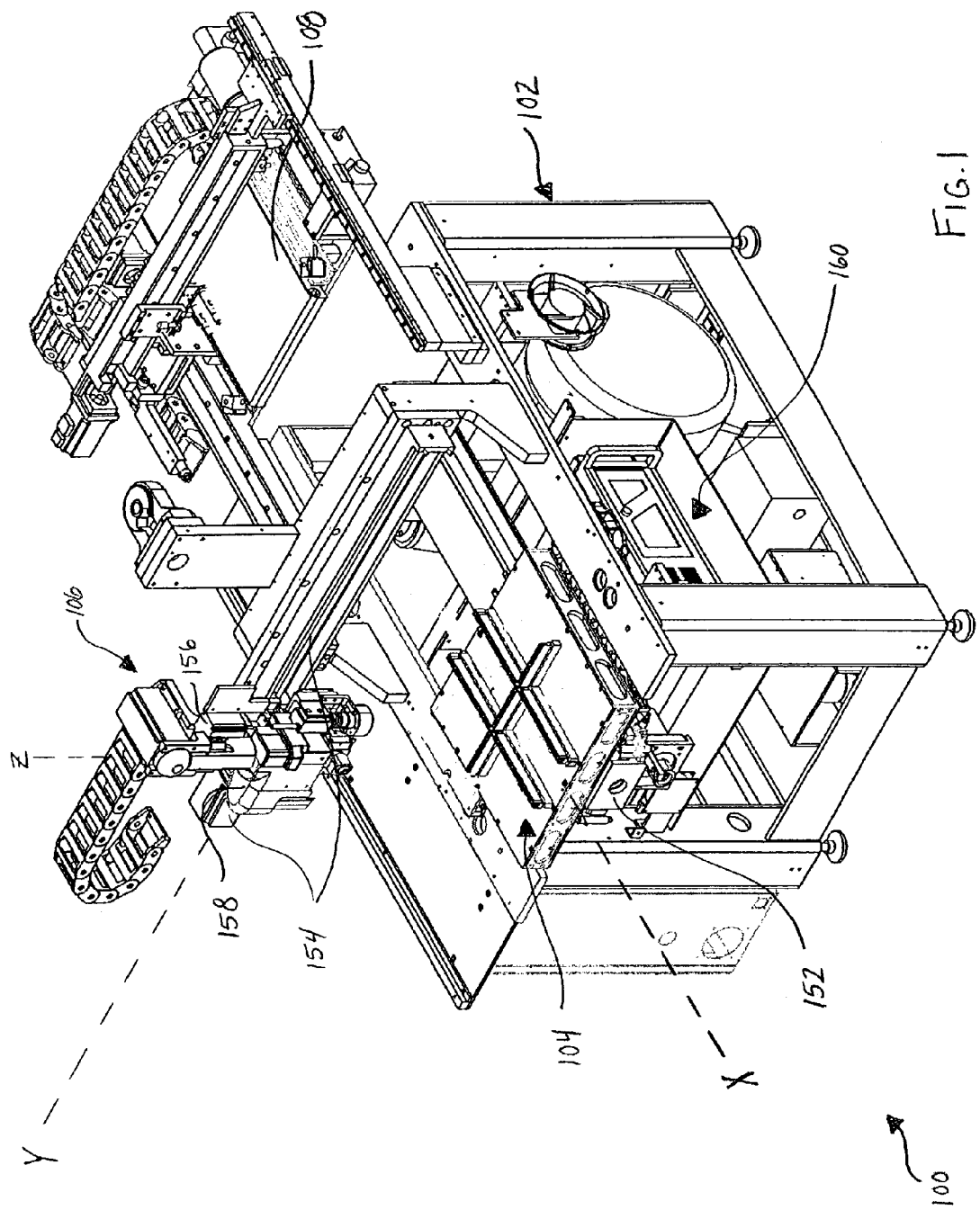
FIG. 1 illustrates a depaneling system in an example of the invention.
Figure 2:
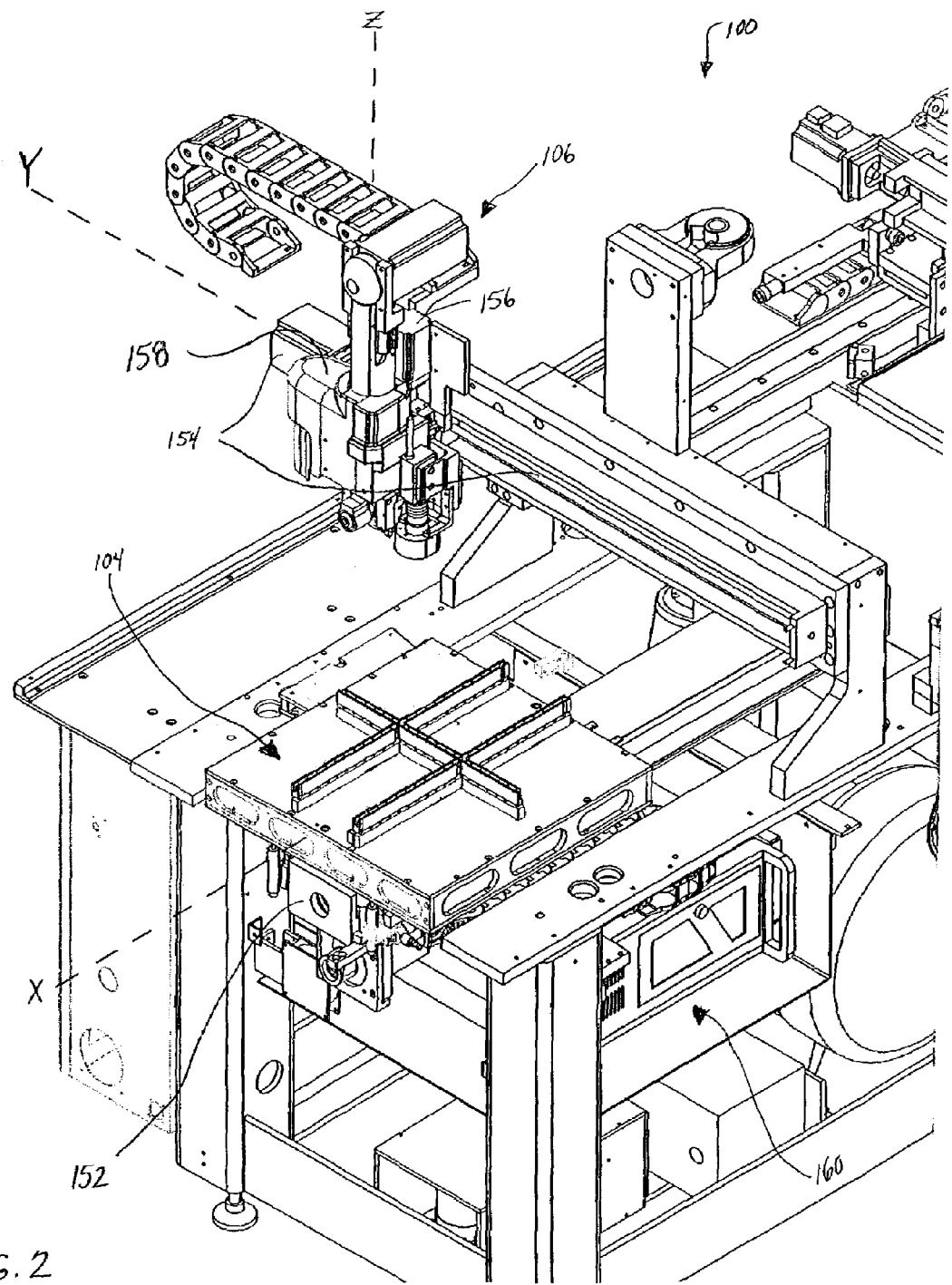
FIG. 2 illustrates a close up view of a tooling apparatus and a cutting apparatus in an example of the invention.

Depaneling System—FIGS. 1-2

FIG. 1 illustrates a depaneling system 100 in an example of the invention. Depaneling system 100 is comprised of many components, some of which will not be discussed for the sake of brevity. In particular, depaneling system 100 is comprised of a frame 102, a tooling apparatus 104, a cutting apparatus 106, an offload station 108, and a controller 160. In relation to the ground, cutting apparatus 106 is positioned above tooling apparatus 104. Cutting apparatus 106 and tooling apparatus 104 function together to cut circuit boards from a panel.

Tooling apparatus 104 is configured to move along an X-axis using a movement system 152. Movement system 152 may comprise a lead screw driven by a servo motor. Tooling apparatus 104 is configured to support a panel (not shown) comprising an array of circuit boards, and apply suction to hold the panel in place when the circuit boards are cut from the panel. Tooling apparatus 104 is discussed in more detail below.

Cutting apparatus 106 is configured to move along a Y-axis and a Z-axis. Cutting apparatus 106 moves along the Y-axis using movement system 154. Movement system 154 may also comprise a lead screw driven by a servo motor. Cutting apparatus 106 moves along the Z-axis using movement system 156. Movement system 156 may also comprise a lead screw driven by a servo motor. Cutting apparatus 106 rotates about the Z-axis using movement system 158. Movement system 158 may also comprise a theta motor that drives a belt to rotate cutting apparatus 106. Cutting apparatus 106 is configured to cut the panel supported by tooling apparatus 104. Cutting apparatus 106 is discussed in more detail below.

FIG. 2 illustrates a close up view of tooling apparatus 104 and cutting apparatus 106 in an example of the invention.

In operation, a user of depaneling system 100 has a panel comprising an array of circuit boards, such as Printed Circuit Boards (PCB). Assume the user wants the individual circuit boards to be cut, scored, or separated from the panel. The user places the panel on the top side of tooling apparatus 104. Tooling apparatus 104 holds the panel in place using suction. Tooling apparatus 104 may also hold the panel in place using registration pins, clamps, or other devices. With the panel properly placed on the tooling apparatus 104, movement system 152 moves tooling apparatus 104 along the X-axis into a position for cutting the panel.

Controller 160 in depaneling system 100 is programmed to cut the panel in a particular pattern to separate the individual circuit boards from the panel. Controller 160 controls cutting apparatus 106 and tooling apparatus 104 to cut the panel in the specified pattern. In controlling cutting apparatus 106, controller 160 moves cutting apparatus 106 along the Y-axis, moves cutting apparatus 106 along the Z-axis to make cutting apparatus 106 contact the panel or to pull cutting apparatus 106 away from the panel, and rotates cutting apparatus about the Z-axis. In controlling tooling apparatus 104, controller 160 moves tooling apparatus 104 along the X-axis.

The invention described herein encompasses depaneling systems wherein the movement of tooling apparatus 104 and cutting apparatus 106 are different than described above. For instance, a depaneling system where the tooling system moves along the Y-axis and the Z-axis and the cutting system moves along the X-axis is within the scope of the invention. Also, a depaneling system where the tooling system moves along the X-axis and the cutting system moves along the X, Y, and Z axes is within the scope of the invention.

Cutting apparatus 106 generates dust particles when cutting the panel. Tooling apparatus 104 collects the dust particles generated on the tooling apparatus side of the panel using suction. Cutting apparatus 106 collects the dust particles generated on the cutting apparatus side of the panel also using suction. Collecting the dust particles from both sides of the panel helps to reduce the amount of dust particles emitted into the air.

When the individual circuit boards are cut from the panel, tooling apparatus 104 moves along the X-axis to offload station 108. The circuit boards are removed from tooling apparatus 104 and placed on offload station 108 to be moved to another machine. Tooling apparatus 104 then tilts to dump debris resulting from the cutting of the panel. Tooling apparatus 104 then returns to its original position to receive another panel for cutting.

Depaneling system 100 may be one component in a line of components. Therefore, some of the operations of the user described may be performed automatically by machines in line with depaneling system 100. Based on this disclosure and the figures, those skilled in the art will appreciate how to modify existing depaneling systems to make depaneling system 100.

Figure 3:
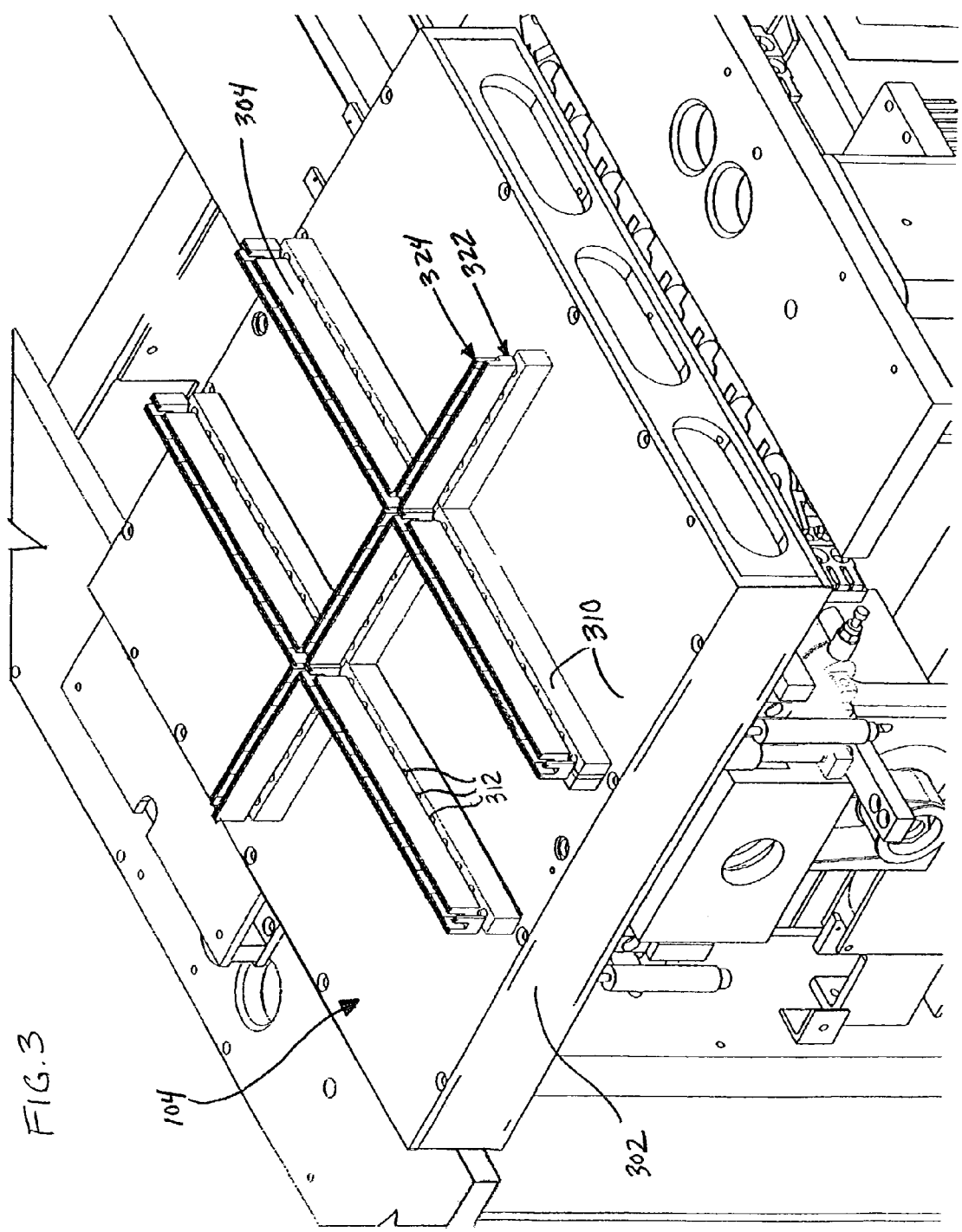
FIG. 3 illustrates a tooling apparatus in an example of the invention.
Figure 4:
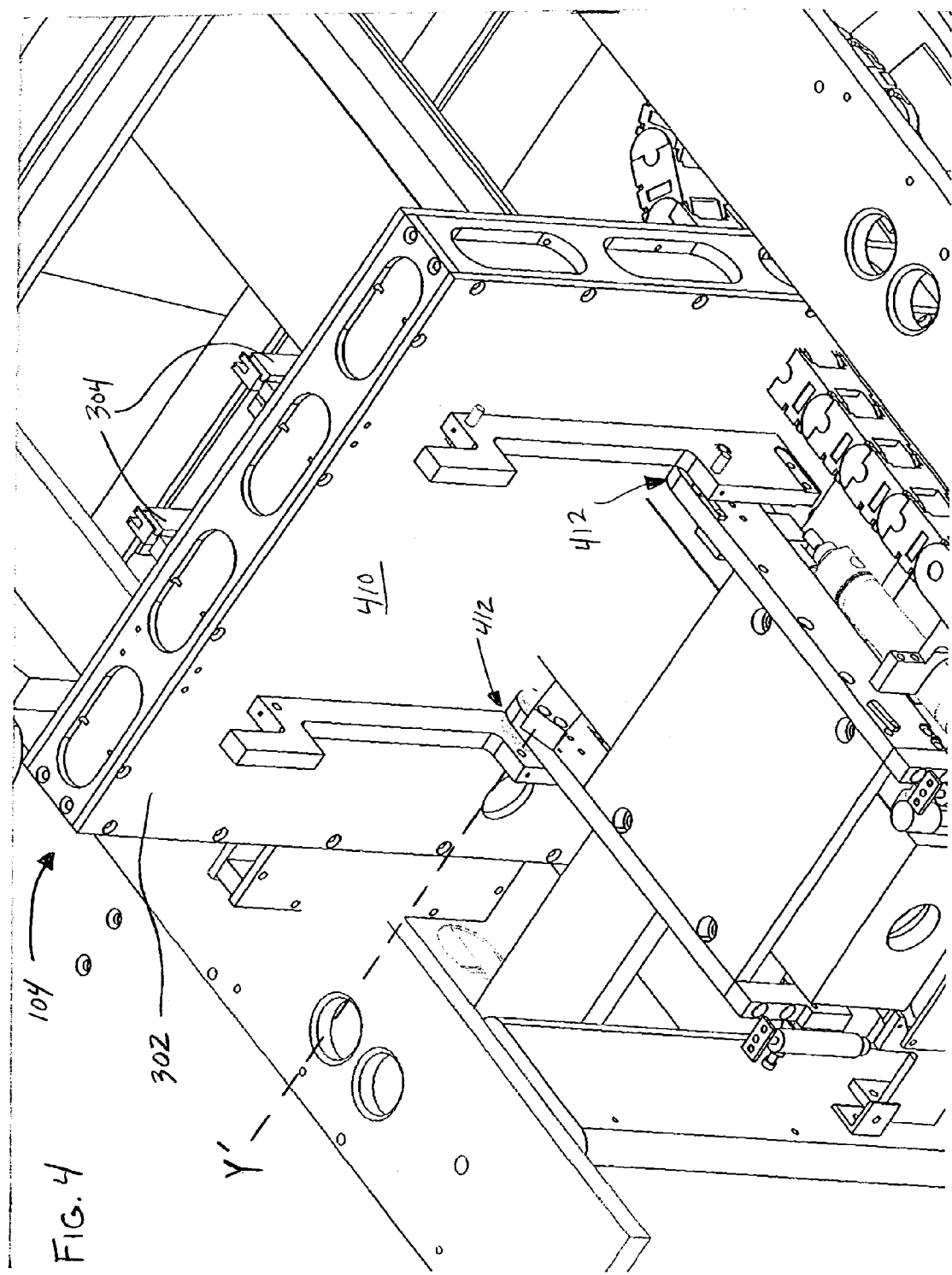
FIG. 4 illustrates a tooling apparatus as it is tilted to remove debris in an example of the invention.

Tooling Apparatus—FIGS. 3-4

FIG. 3 illustrates tooling apparatus 104 in an example of the invention. Tooling apparatus 104 is comprised of a vacuum chamber 302 and a vacuum channel 304. Vacuum chamber 302 has a top side 310 having one or more openings 312. The top side 310 of vacuum chamber 302 is configured to interface with vacuum channel 304. Vacuum chamber 302 may also include a vacuum hose connector (not shown) configured to couple to a hose of a vacuum.

Vacuum channel 304 has a bottom side 322 configured to interface with the top side 310 of vacuum chamber 302. Vacuum channel 304 also has a top side 324 configured to interface with the panel (not shown) being cut. Vacuum channel 304 includes one or more openings (not shown) passing from the bottom side 322 to the top side 324. The openings in vacuum channel 304 correspond with, or interface with, the openings 312 in the top side 310 of vacuum chamber 302.

The top side 324 of vacuum channel 304 is configured to support and help hold a panel to be cut. The top side 324 of vacuum channel 304 may comprise a pliable material, such as rubber, to better hold the panel. Vacuum chamber 302 and/or vacuum channel 304 may also include registration pins, clamps, or other devices to help support and hold the panel for cutting.

In operation, a user of depaneling system 100 places a panel to be cut on the top side 324 of vacuum channel 304.

The vacuum hose connector of vacuum chamber 302 is coupled to a vacuum in depaneling system 100. To create a vacuum in vacuum chamber 302, the vacuum is turned on. Suction from vacuum chamber 302 pulls air down from the top side 324 of vacuum channel 304, through the openings in vacuum channel 304 and vacuum chamber 302, and into vacuum chamber 302. The suction and the interface between the panel and vacuum channel 304 produces a seal that helps hold the panel in place for cutting.

Vacuum channel 304 and the openings 312 in the top side 310 of vacuum chamber 302 correspond with the pattern to be cut on the panel. Vacuum channel 304 is configured to be positioned underneath the panel wherever, or substantially wherever, a cut on the panel is to be made. In other words, the pattern of vacuum channel 304 matches, or substantially matches, the pattern to be cut on the panel. Vacuum channel 304 may be customized for each different cutting pattern. The top side 310 of vacuum chamber 302 may also be customized for each different cutting pattern.

When the panel is properly placed on vacuum channel 304, tooling apparatus 104 moves along the X-axis into a cutting position. Cutting apparatus 106 begins to cut the panel from the top side of the panel. Underneath the panel, vacuum channel 304 has the same pattern as the cuts being made. When cutting apparatus 106 cuts the panel and generates dust particles, the suction through vacuum channel 304 collects the dust particles from the tooling apparatus side of the panel. The dust particles pass from vacuum channel 304 and through vacuum chamber 302 to the vacuum. Cutting apparatus 106 may also include suction to collect the dust particles on the cutting apparatus side of the panel.

When cutting apparatus 106 finishes cutting the circuit boards out of the panel, the vacuum is shut off. Tooling apparatus 104 moves along the X-axis to offload station 108 (see FIG. 1). The circuit boards are removed from tooling apparatus 104, leaving the debris from the panel. The dust particles are sucked away by the vacuum, but the larger pieces remain on top of tooling apparatus 104.

To remove the debris, tooling apparatus 104 may also include a pivot apparatus configured to tilt tooling apparatus 104 about an axis. FIG. 4 illustrates tooling apparatus 104 as it is tilted to remove the debris in an example of the invention. Pivot apparatus 412 is coupled to the bottom side 410 of vacuum chamber 302. Pivot apparatus 412 allows tooling apparatus 104 to tilt about an axis, labeled Y', to dump the debris. With the debris removed, tooling apparatus 104 tips back to its normal position and moves along the X-axis back to its original position.

If the same cut pattern is being made, the user places another panel on tooling apparatus 104 and repeats the above operation. If a different cut pattern is desired, then vacuum channel 304 and/or the top side 310 of vacuum chamber 302 needs to be swapped out for new ones that match the new cutting pattern.

As stated above, depaneling system 100 may be one component in a line of components. Therefore, some of the operations of the user described may be performed automatically by machines in line with depaneling system 100.

Tooling apparatus 104 advantageously uses a vacuum or suction to collect the dust particles from the tooling apparatus side of the panel, instead of just collecting the dust particles from the cutting apparatus side. Tooling apparatus 104 also advantageously uses the vacuum to help hold the panel in place for cutting.

Figure 5:
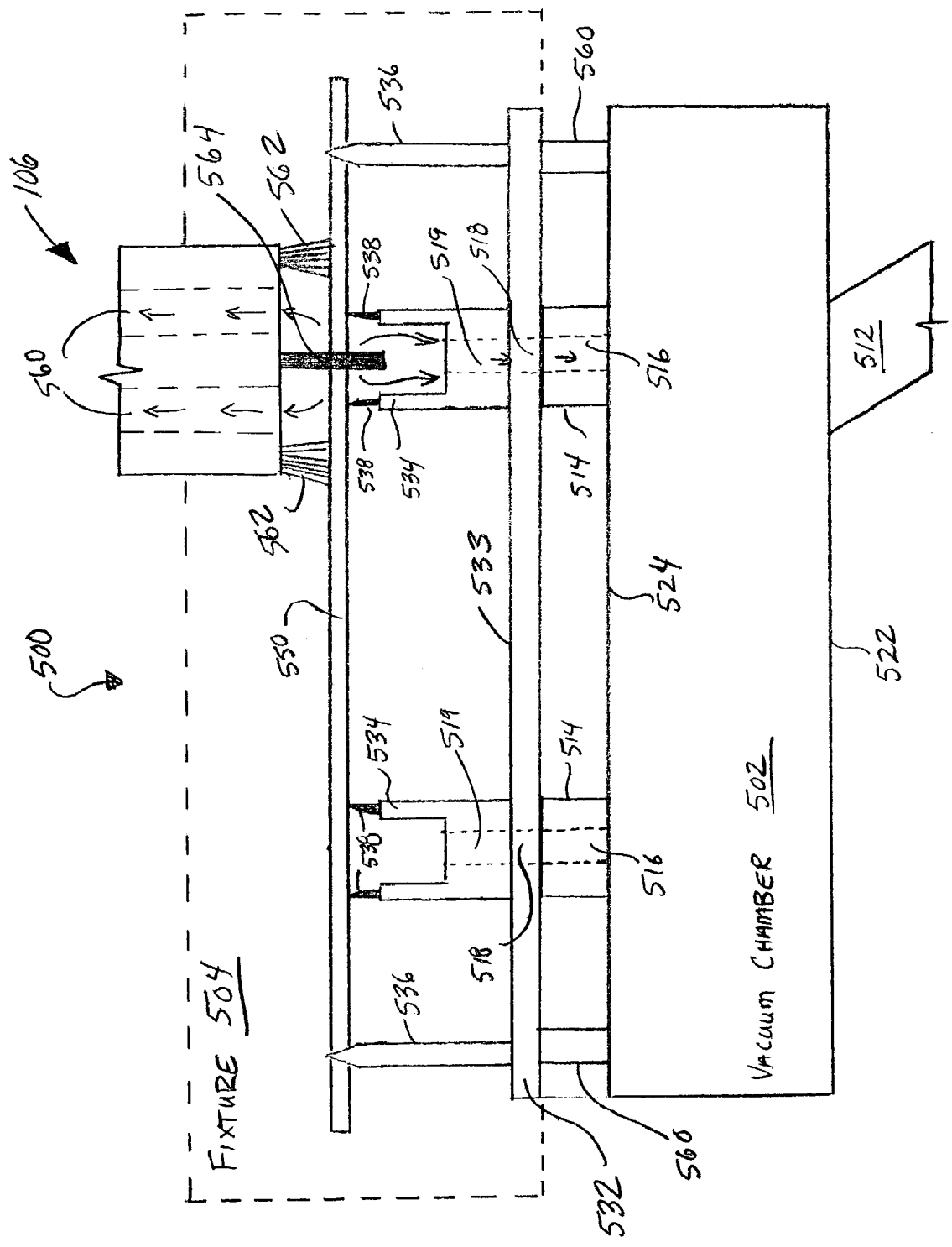
FIG. 5 illustrates a side view of another example of a tooling apparatus in an example of the invention.

Another Tooling Apparatus Example—FIG. 5

FIG. 5 illustrates a side view of another example of a tooling apparatus 500 in an example of the invention. Tooling apparatus 500 includes a vacuum chamber 502 and a fixture 504. Vacuum chamber 502 comprises a vacuum hose connector 512 coupled to a bottom side 522 of the vacuum chamber 502 and spacers 514 coupled to a top side 524 of vacuum chamber 502. The top side 524 of vacuum chamber 502 may be removable. Spacers 514 have openings 516, or holes, extending through spacer 514 and into vacuum chamber 502.

Fixture 504 comprises a base 532, vacuum channels 534, and registration pins 536. Base 532 is configured to sit atop spacers 514 of vacuum chamber 502. Base 532 has openings 518, or holes, extending through the base 532 to match up with openings 516 of vacuum chamber 502. Base 532 is fixed to vacuum chamber 502 by a securing/locating mechanism 560, such as a bolt, screw, etc. Vacuum channels 534 are coupled to a top side 533 of base 532. Vacuum channels 534 are U-shaped members that have openings 519 extending through vacuum channels 534 to match up with openings 518. The tops of vacuum channels 534 include end segments 538. End segments 538 are made of a pliable material, such as rubber. Registration pins 536 couple to the top side 533 of base 532 and extend perpendicularly to the top side 533 of base 532. Registration pins 536 and vacuum channels 534 are configured so that a panel rests on both the registration pins 536 and end segments 538 of vacuum channels 534 simultaneously, as is illustrated by panel 550.

In operation, a vacuum hose is connected to vacuum hose connector 512. The vacuum hose creates a vacuum in vacuum chamber 502. The vacuum causes air to flow from the top side of vacuum channels 534, through openings 519, 518, and 516, and into vacuum chamber 502. When panel 550 is placed atop registration pins 536 and end members 538, the air flow creates suction between panel 550 and end members 538. This suctions helps hold panel 550 in place on the registration pins 536.

Vacuum channels 534 correspond to the cuts to be made by the cutting apparatus. FIG. 5 shows cutting apparatus 106 making a cut on panel 550. Part of the saw blade 564 of cutting apparatus 106 extends down into the void area within vacuum channel 534. The saw blade 564 generates dust particles when cutting the panel, and the suction Within vacuum channel 534 collects the dust particles (illustrated by the arrows). The dust particles travel from vacuum channels 534 and through vacuum chamber 502 to the vacuum. By being pliable, end members 538 create a seal that allows vacuum channel 534 to collect most of the dust particles.

Cutting apparatus 106 also has suction chambers 560 for collecting dust particles on the cutting apparatus side of panel 550. Cutting apparatus includes brushes 562 that contact the panel. The brushes create a seal between suction chambers 560 and panel 550 so that suction chambers 560 can collect the dust particles (illustrated by the arrows).

Fixture 504 and the top side 524 and spacers 514 of vacuum chamber 502 are customized for each different cut pattern. To change patterns, fixture 504 is unbolted from the top side 524 of vacuum chamber 502 and removed. The top side 524 is also unbolted from vacuum chamber 502 and removed. A new top side and a new fixture are attached to vacuum chamber 502. The new top side and new fixture match the new cutting pattern of the depaneling system.

Cutting Apparatus—FIGS. 6-9

Figure 6:
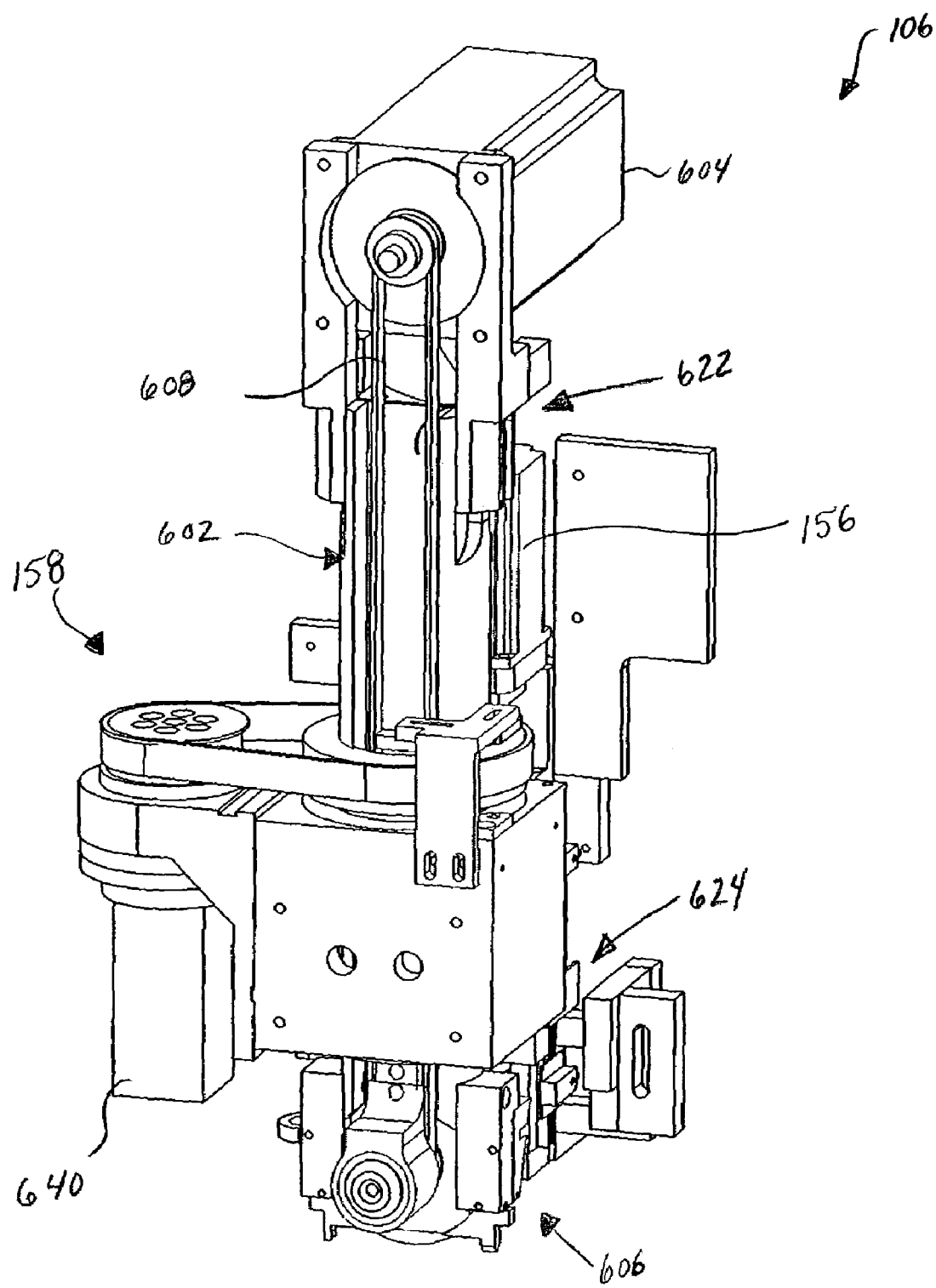
FIGS. 6-7 illustrate a cutting apparatus in an example of the invention.
Figure 7:
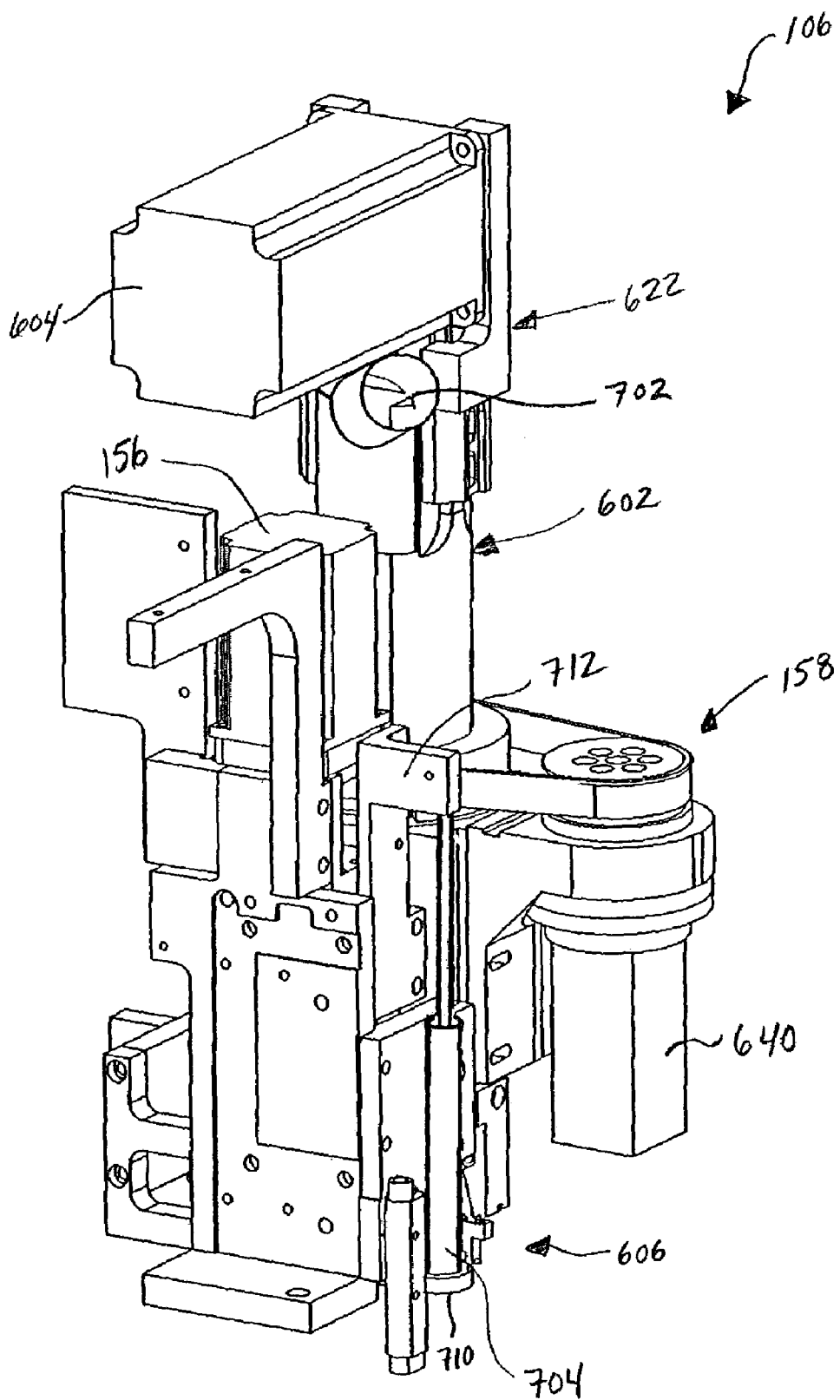

FIGS. 6-7 illustrate cutting apparatus 106 in an example of the invention. Cutting apparatus 106 is comprised of a housing 602, a drive motor 604, a cutting unit 606, and a drive connector 608. Housing 602 comprises a top end 622 and a bottom end 624. Drive motor 604 is coupled to the top end 622 of housing 602. Cutting unit 606 is coupled to the bottom end 624 of housing 602. Drive connector 608 is configured to couple drive motor 604 to cutting unit 606 to rotate cutting unit 606. An example of drive connector 608 is a belt.

Figure 8:
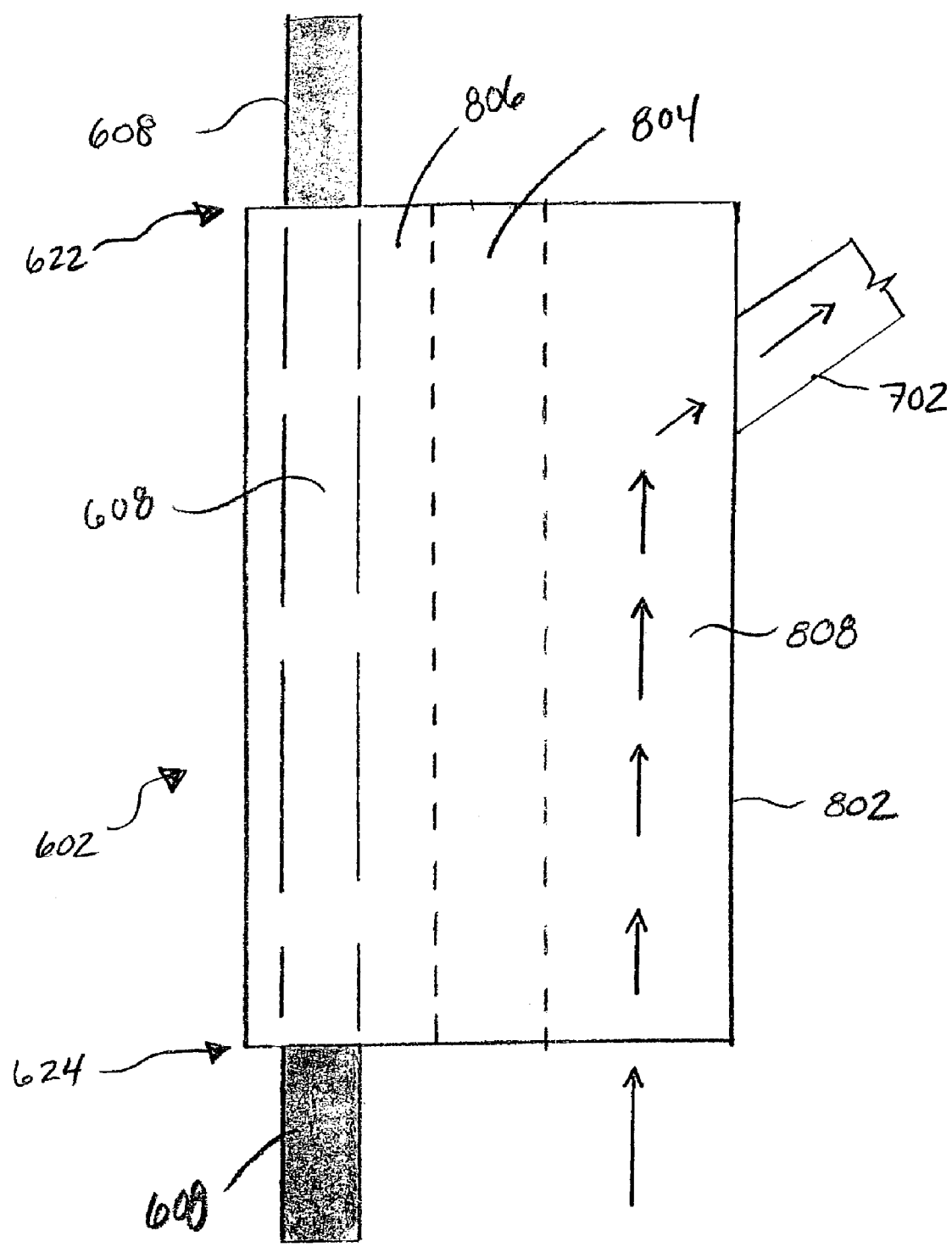
FIG. 8 illustrates a side view of a housing in an example of the invention.

FIG. 8 illustrates a side view of housing 602 in an example of the invention. Housing 602 comprises an outer shell 802 and a dividing member 804. Dividing member 804 separates a drive section 806 and a vacuum section 808 within outer shell 802. Drive section 806 extends from the top end 622 of housing 602 to the bottom end 624 of housing 602. Drive connector 608 extends from drive motor 604 through drive section 806 of housing 602 to cutting unit 606. Vacuum section 808 extends from the bottom end 624 of housing 602 to vacuum hose connector 702. Vacuum section 808 forms an enclosure between the bottom end 624 of housing 602 and vacuum hose connector 702 so that an attached vacuum can cause air to flow in the direction of the arrows. Drive section 806 does not necessarily have to form an enclosure, as a user may want to view drive connector 608 to ensure proper operation.

Figure 9:
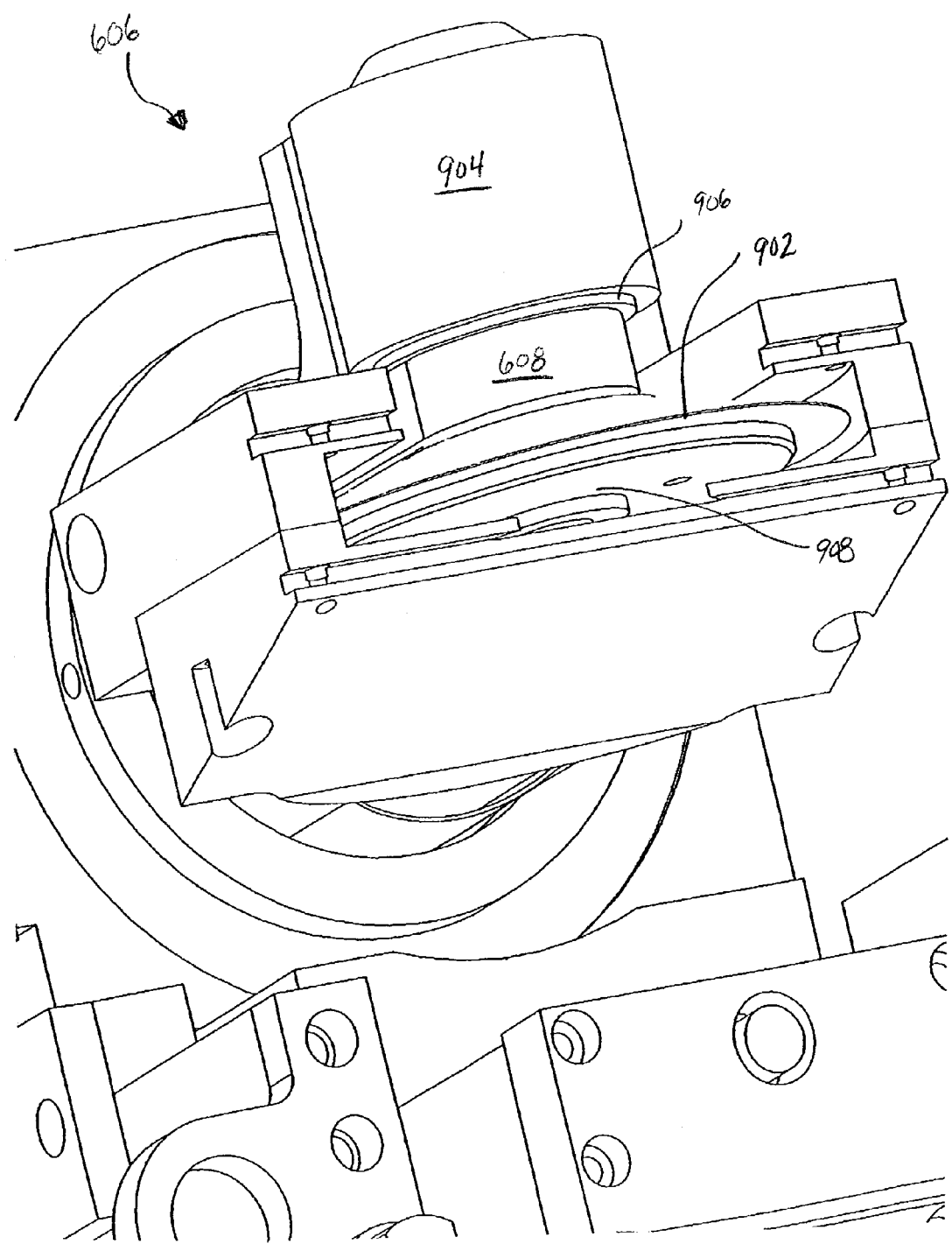
FIG. 9 illustrates a bottom view of a cutting unit in an example of the invention.

FIG. 9 illustrates a bottom view of cutting unit 606 in an example of the invention. Cutting unit 606 comprises a saw blade 902, a bearing system 904, a pulley 906, and an arbor 908. Bearing system 904 may include a shaft for pulley 906 (now shown) and bearings (not shown). Drive connector 608 is configured to couple to pulley 906 to rotate saw blade 902.

Referring again to FIGS. 6-7, cutting apparatus 106 may be movably coupled to housing 602 so that cutting unit 606 can be rotated about the Z-axis (see FIG. 1). Cutting apparatus 106 includes a theta motor 640 that is configured to orientate cutting unit 606. For instance, cutting unit 606 may initially be orientated to cut along the X-axis (see FIG. 1). If cutting unit 606 is to cut along the Y-axis instead, theta motor 640 rotates cutting unit 606 to orientate cutting unit 606 on the proper axis. Theta motor 640 may be able to rotate cutting unit 606 270° about the Z-axis. Theta motor 640 does not rotate saw blade 902 for cutting the panel, but rotates cutting unit 606 so that saw blade 902 is pointing in the right direction.

Cutting apparatus 106 also includes an air cylinder 704 configured to help balance the weight of cutting apparatus 106 and to help support cutting apparatus 106. The bottom portion of air cylinder 704 is coupled to a fixed bracket 710 on depaneling system 100. The top portion of air cylinder 704 is coupled to a bracket 712 on cutting apparatus 106. Air cylinder 704 eases the load on the motor that moves cutting apparatus 106 along the Z-axis, as cutting apparatus 106 may be relatively heavy.

In operation, a vacuum hose is connected to vacuum hose connector 702. The vacuum hose creates a vacuum in vacuum section 808. The vacuum causes air to flow from the around saw blade 902 and up through vacuum section 808 to vacuum hose connector 702.

Tooling apparatus 104 moves a panel to be cut into position under cutting apparatus 106. Drive motor 604 turns drive connector 608 which turns saw blade 902. Drive motor 604 turns saw blade 902 between 500 and 2000 rpm. Saw blade 902 cuts the panel. While cutting the panel, saw blade 902 generates dust particles. The suction from vacuum section 808 collects the dust particles and transfers the dust particles up through vacuum section 808. Vacuum section 808 collects the dust particles on the cutting apparatus side of the panel, while vacuum channel 304 collects the dust particles on the tooling apparatus side of the panel (see FIG. 3).

To increase the dust collecting ability of vacuum section 808, cutting unit 606 may include a dust hood (not shown). The dust hood substantially encloses the area around saw blade 902 between the top of cutting unit 606 and the panel. The dust hood may include brushes that contact the panel to make the enclosure (see FIG. 5).

Cutting apparatus 106 advantageously uses drive connector 608 to drive cutting unit 606 instead of being a direct drive between drive motor 604 and cutting unit 606. Using drive connector 608 and separating drive motor 604 from cutting unit 606 with housing 602 advantageously drives cutting unit 606 much slower than current direct drive systems. For instance, many direct drive motors spin a saw blade at 10,000 to 50,000 rpm, where drive motor 604 spins saw blade 902 between 500 and 2000 rpm. The slower speed of the saw blade increases the life of the saw blade. The slower speed also generates a less fine of a dust when cutting the panel. This advantageously results in a more efficient and a cleaner cutting apparatus.

What is claimed is:

1. A depaneling system for cutting circuit boards from a panel, said depaneling system comprising:
   a tooling apparatus that supports said panel, holds said panel in place with suction during cutting of said circuit boards from said panel, and collects dust particles generated by cutting of said circuit boards from said panel with said suction; and
   a cutting apparatus that cuts said circuit boards from said panel supported by said tooling apparatus, said cutting apparatus comprising:
   a housing having a first end and a second end;
   a drive motor coupled to said first end of said housing;
   a saw blade coupled to said second end of said housing to separate said saw blade from said drive motor; and
   a drive connector configured to couple said drive motor to said saw blade to rotate said saw blade;
   said housing further having a first section and a second section separated by a dividing member, said first section extending from said first end of said housing to said second end of said housing wherein said drive connector extends from said drive motor through said first section to said saw blade, said second section forming an enclosure between said second end of said housing and a vacuum hose connector.

2. The depaneling system of claim 1 wherein said tooling apparatus comprises:
   a vacuum chamber having at least one opening on a top side that provides suction to said at least one opening; and
   a vacuum channel having a first side that interfaces with said top side of said vacuum chamber, having a second side that interfaces with said panel, and having at least one opening to interface with said at least one opening of said vacuum chamber;
   said vacuum chamber and said vacuum channel help hold said panel in place with said suction during cutting of said circuit boards from said panel by said cutting apparatus;
   said vacuum chamber and said vacuum channel collect said dust particles generated by said cutting of said circuit boards from said panel.

3. The depaneling system of claim 2 wherein said vacuum chamber comprises:
   a vacuum hose connector coupled to a vacuum hose.

4. The depaneling system of claim 2 further comprising:
   a pliable material on said second end of said vacuum channel to interface with said panel.

5. The depaneling system of claim 2 wherein said panel is to be cut in a pattern and wherein said vacuum channel corresponds with said pattern.

6. The depaneling system of claim 2 further comprising:
   a fixture coupled to said vacuum chamber, said fixture comprising:
      a base having a first side and a second side, said first side interfaces with said top side of said vacuum chamber, said base further having at least one opening that corresponds with said at least one opening of said vacuum chamber;
      said vacuum channel having said first side of said vacuum channel interface with said second side of said base, having said second side of said vacuum channel interface with said panel, and having said at least one opening of said vacuum channel interface with said at least one opening of said base; and
      at least one registration pin extending perpendicular from said base to support said panel.

7. The depaneling system of claim 2 wherein said top side of said vacuum chamber is removable.

8. The depaneling system of claim 1 wherein said tooling apparatus comprises:
   at least one registration pin that supports said panel.

9. The depaneling system of claim 1 wherein said tooling apparatus comprises:
   a pivot system connected to a bottom side of said tooling apparatus that allows said tooling apparatus to pivot about an axis to remove debris resulting from the cutting of said panel.

10. The depaneling system of claim 1 wherein said second section provides suction to said second end of said housing to collect dust particles around said saw blade.

11. The depaneling system of claim 1 wherein said drive motor spins said saw blade at a speed less than 3000 rpm.

12. The depaneling system of claim 1 wherein said drive connector comprises a belt.

13. The depaneling system of claim 1 wherein said cutting apparatus further comprises:
   an air cylinder connected to said depaneling system and configured to balance the weight of said cutting apparatus.

* * * * *